United States Patent [19]

te Velde et al.

[11] Patent Number: 4,528,583
[45] Date of Patent: Jul. 9, 1985

[54] PROGRAMMABLE SEMICONDUCTOR DEVICE AND METHOD OF MANUFACTURING SAME

[75] Inventors: Ties S. te Velde; Arie Slob, both of Eindhoven, Netherlands

[73] Assignee: U.S. Philips Corporation, New York, N.Y.

[21] Appl. No.: 601,894

[22] Filed: Apr. 19, 1984

Related U.S. Application Data

[63] Continuation of Ser. No. 258,113, Apr. 27, 1981, abandoned.

[30] Foreign Application Priority Data

May 8, 1980 [NL] Netherlands ........................ 8002635

[51] Int. Cl.³ .................... G11C 11/40; H01L 27/04; H01L 23/52
[52] U.S. Cl. ........................ 357/71; 357/51; 357/68
[58] Field of Search .............. 357/51, 65, 68, 71

[56] References Cited

U.S. PATENT DOCUMENTS

| | | | |
|---|---|---|---|
| 3,539,705 | 11/1970 | Nathanson et al. | 357/68 |
| 3,553,540 | 1/1971 | Puterbaugh, Jr. | 357/68 |
| 3,564,354 | 2/1971 | Aoki et al. | 357/68 |
| 3,575,645 | 4/1971 | Doversberger et al. | 357/68 |
| 4,070,654 | 1/1978 | Tachi | 357/15 |
| 4,222,062 | 9/1980 | Trotter | 357/60 |

OTHER PUBLICATIONS

Petersen, IBM Technical Disclosure Bulletin, vol. 20, No. 12, May 1978, p. 5309.

Primary Examiner—William D. Larkins
Attorney, Agent, or Firm—Jack E. Haken; James J. Cannon, Jr.

[57] ABSTRACT

A programmable semiconductor device having a microswitch (11) which over a part of its length is provided separately from a bridging conductor (10), for example, a word line and a supporting element. Since the dimensions of the switch (11) and the conductor (10) are independent of each other, the resistance of the conductor (10) may be low so that programmable memories having a high read-in and read-out rate are obtained. In addition the circuit element, for example a Schottky diode (3, 8) can be realized below the bridging part (12) of the conductor (10), which results in a high bit density. Since the switch (11) is present below the conductor (10) the assembly can be passivated in the unprogrammed state by means of a protective layer (20), so that the switch 11 is encapsulated in a hollow space (21).

13 Claims, 12 Drawing Figures

PROGRAMMABLE SEMICONDUCTOR DEVICE AND METHOD OF MANUFACTURING SAME

This is a continuation of application Ser. No. 258,113, filed Apr. 27, 1981 now abandoned.

BACKGROUND OF THE INVENTION

1. Field of the Invention

The invention relates to a programmable semiconductor device comprising a supporting member having a semiconductor circuit element and an electric conductor which belongs to a first line and which can be electrically conductively connected to the semiconductor circuit element.

In addition the invention relates to a method of manufacturing such a semiconductor device.

A programmable semiconductor device of the above-mentioned kind may form part for example, of a programmable read-only memory (PROM). Besides for a programmable read-only memory the programmable semiconductor device may also be used, for example, for a logic circuit of the type PLA (programmable logic array) in which the actual logic function of the circuit is fixed afterwards by means of a programming step.

2. Description of the Prior Art

A programmable semiconductor device of the kind mentioned in the opening paragraph is disclosed in U.S. Pat. No. 3,781,977. In the device shown a thin layer of insulating material is present between an electric conductor and a semiconductor circuit element (diode). A connection between the conductor and the diode is obtained by applying a potential difference between the conductor and a zone of the diode such that material of the conductor penetrates into the insulating material and thus forms a connection. In order to reach this effect a rather high voltage is necessary. The required voltage becomes lower if the thickness of the thin layer of insulating material is reduced but this increases on the other hand the possibility of undesired initial connections between conductor and diode as a result of possible defects in the insulating material.

SUMMARY OF THE INVENTION

It is an object of the invention inter alia to provide a programmable semiconductor device in which the programmable connection between the conductor and the semiconductor circuit element is obtained in quite a different manner.

Another object of the invention is to provide a programmable read-only memory having a bit density and read-out rate which are as high as possible.

It is based inter alia on the recognition of the fact that such connections can advantageously be produced by means of an electrostatic attraction between the conductor and a circuit element and that notably when programmable semiconductor devices according to the invention are used in programmable read-only memories the write time (programming time) of such memories can be considerably shortened in that it is possible to choose the dimensions of the circuit element quite independently of those of the conductor which forms part of a selection line.

In addition it is based on the recognition of the fact that with suitable choice of the place of the programmable connection a high bit density and the possibility of passivating of such a device in an unprogrammed condition can be obtained.

According to the invention, a first embodiment of a programmable semiconductor device is characterized in that the device comprises a strip of electrically conductive material which is electrically conductively connected at least at one end to the conductor belonging to the first line, which strip is separated from the semiconductor circuit element or a contact layer connected thereto electrically conductively at least over a part of its length by gas or a vacuum, which part extends separately from the electric conductor above the semiconductor circuit element or the contact layer and is separated therefrom by an intermediate space proportioned such that as a result of electrostatic attraction between the strip and the semiconductor circuit element or the contact layer a connection can be formed between the strip and the semiconductor circuit element or the contact layer.

A second embodiment of a programmable semiconductor device according to the invention is characterized in that the device comprises a strip of electrically conductive material which is connected electrically conductively to the semiconductor circuit element in which a part of the strip extends separately from the supporting member, the semiconductor circuit element or a contact layer connected therewith electrically conductively below the electric conductor belonging to the first line, which part is separated from the conductor by gas or vacuum by an intermediate space between the strip and the conductor proportioned such that as a result of the electrostatic attraction between the strip and the conductor a connection can be formed between the strip and the conductor.

A first advantage of such devices consists in that the connection between the conductor and the semiconductor circuit element can be realized in a very reliable manner. Furthermore they have the advantage that for the conductor belonging to the first line which can form, for example, a part of a word selection line in a programmable read-only memory, a conductor with a sufficiently large cross-section may be used so as to obtain a read and write time which are as short as possible, while simultaneously for the strip of electrically conductive material such a suitable thickness may be chosen that programming by means of electrostatic attraction can take place without unnecessarily high voltages.

It is to be noted that the provision by means of electrostatic attraction of an electric connection between a conductive surface present on a semiconductor body and a conductor extending thereabove has already been suggested in U.S. Pat. No. 3,539,705.

Since in addition the semiconductor circuit element (for example a diode), can be provided below the strip for the greater part, programmable read-only memories having a high bit density can be obtained.

A preferred embodiment of a programmable semiconductor device in accordance with the invention is characterized in that the strip is present in a hollow space the walls of which can be formed at least partly by protective material which is provided over parts of the supporting member or the semiconductor circuit element present beside the conductor.

The advantage of this embodiment is that protecting material (passivating layer) can be provided before the actual programming takes place so that the semiconductor device can be packaged and delivered in an unprogrammed state.

The strip of electrically conductive material which may comprise, for example, one of the materials nickel, cobalt or platinum, preferably has a thickness of at most 0.5 micrometer. Herewith it is achieved that the required electrostatic forces can be generated by means of electric voltages which can be used in practice without damaging the device during programming. For the same reason, the intermediate space between the semiconductor circuit element and the separately extending part of the strip is preferably at most 0.5 micrometer.

For use in a programmable semiconductor memory a preferred embodiment of a programmable semiconductor device in accordance with the invention is characterized in that the first line forms part of a first group of lines which forms a cross-bar system with a second group of lines which cross the first group, the semiconductor circuit element being present at the area of a crossing of the cross-bar system and being connected to a line of the second group.

A further preferred embodiment of a programmable semiconductor device in accordance with the invention is characterized in that the supporting member comprises a semiconductor body in which the semiconductor circuit element is provided.

The advantage of such a construction is that in the semiconductor body other circuit elements may also be provided, for example, decoders for selection purposes and output amplifiers. Moreover, in such a device the second group of lines may be constructed fully or partly as zones buried in the semiconductor body. Such a buried zone is preferably contacted at regular distances with a strip of electrically conductive material present on the surface of the semiconductor body. The advantage of this is that during programming several current paths to the same semiconductor circuit element are present which in addition have a lower resistance so that a lower voltage will suffice. At the same time, during reading the response time is considerably shortened due to the presence of said low-ohmic parallel connections in the second group of lines.

The semiconductor circuit elements which may be formed, for example, by diodes or transistors in this embodiment preferably comprise diodes having a rectifying junction (Schottky junction) below a low-doped semiconductor zone above the buried zone and an electrode contacting the low-doped semiconductor zone. As a result of this, a memory manufactured with such a device has a high read-out rate.

A method of manufacturing a programmable semiconductor device in accordance with the invention is characterized in that there is started from a supporting member having at a surface at least a semiconductor circuit element which is provided with an electrode or is electrically conductively connected to a contact layer, in which the assembly is covered with a first auxiliary layer after which a strip of electrically conductive material is provided on the first auxiliary layer which strip is present at least partly above the electrode or the contact layer, after which the assembly is covered with a second auxiliary layer and apertures are formed through the first and second auxiliary layers, which apertures coincide at least partly with one end of the strip, after which at least in the apertures a conductor pattern is provided and, using the conductor pattern as a mask, the two auxiliary layers are removed selectively, in which the material of the first auxiliary layer can be etched selectively with respect to the materials of the supporting member, the electrode or the contact layer and the strip, the conductor pattern and, at least insofar as covered by the first auxiliary layer, the material of the semiconductor circuit element, and in which the material of the second auxiliary layer can be etched selectively with respect to the materials of the strip and the conductor track, in which treatment supporting elements of the conductor pattern remain in the apertures between which an electric conductor belonging to a first line of the device extends and in which an electrically conductive strip remains which is connected electrically conductively to the conductor, while at least a part of the strip extends separately from the supporting member, the conductor pattern and the semiconductor circuit element or the contact layer above the semiconductor circuit element or the contact layer.

A method of manufacturing a programmable semiconductor device according to a second embodiment in which the strip in the unprogrammed state is electrically conductively connected to the semiconductor circuit element is characterized in that there is started from a supporting member having at a surface at least a semiconductor circuit element which is provided with an electrode or is electrically conductively connected to a contact layer, after which the assembly is covered with a first auxiliary layer in which a window is provided which exposes at least a part of the electrode or of the contact layer, after which a strip of electrically conductive material is provided on the first auxiliary layer and at least in the window, after which the assembly is covered with a second auxiliary layer and apertures are formed through the first and second auxiliary layers after which at least at the area of one end of the strip and in the apertures a conductor pattern is provided and, using the conductor pattern as a mask, the two auxiliary layers are removed selectively in which the material of the first auxiliary layer can be etched selectively with respect to the materials of the supporting member, the electrode or the contact layer, the strip, the conductor pattern and, at least insofar as covered by the first auxiliary layer, the material of the semiconductor circuit element, and in which the material of the second auxiliary layer can be etched selectively with respect to the materials of the strip and the conductor pattern, in which treatment supporting elements of the conductor pattern remain in the apertures between which a conductor extends belonging to a first line of the device and in which an electrically conductive strip remains which is connected electrically conductively to the semiconductor circuit element, while at least a part of the strip extends separately from the supporting member, the conductor pattern and the semiconductor circuit element or the contact layer below the conductor.

In such methods the same material is preferably used for the first and second auxiliary layers. This provides a simplified and hence cheaper method. A suitable material is, for example, aluminum.

The material of the conductor pattern is preferably provided by electro-deposition. As a matter of fact it has been found that apertures, so-called pinholes may be present in a deposited layer of aluminum. Since in electro-deposition the growth occurs only in one direction it can be prevented that said apertures are filled with the material of the conductor pattern and thus cause possible short-circuits.

BRIEF DESCRIPTION OF THE DRAWINGS

The invention will now be described in greater detail with reference to a few embodiments and the drawing, in which FIG. 9 is a diagrammatic cross-sectional view of another programmable semiconductor device in accordance with the invention, while

DESCRIPTION OF THE PREFERRED EMBODIMENTS

Figure 1:
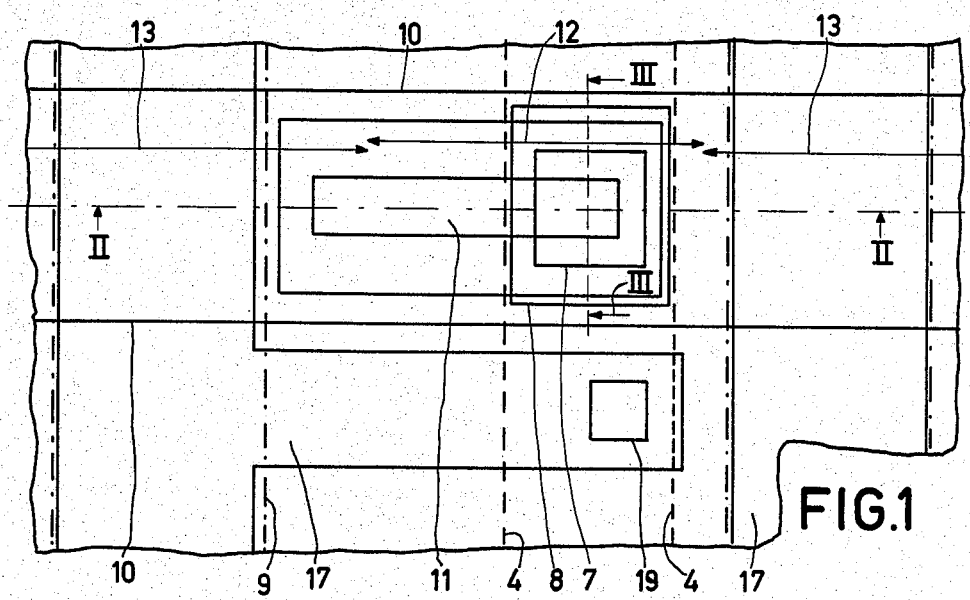
FIG. 1 is a diagrammatic plan view of a first embodiment of a programmable semiconductor device according to the invention.

The figures are diagrammatic and not drawn to scale. For clarity, in the cross-sectional views the dimensions in the direction of thickness are strongly exaggerated. Semiconductor zones of the same conductivity type are generally shaded in the same direction; corresponding parts in the various embodiments are generally referred to by the same reference numerals.

Figure 2:
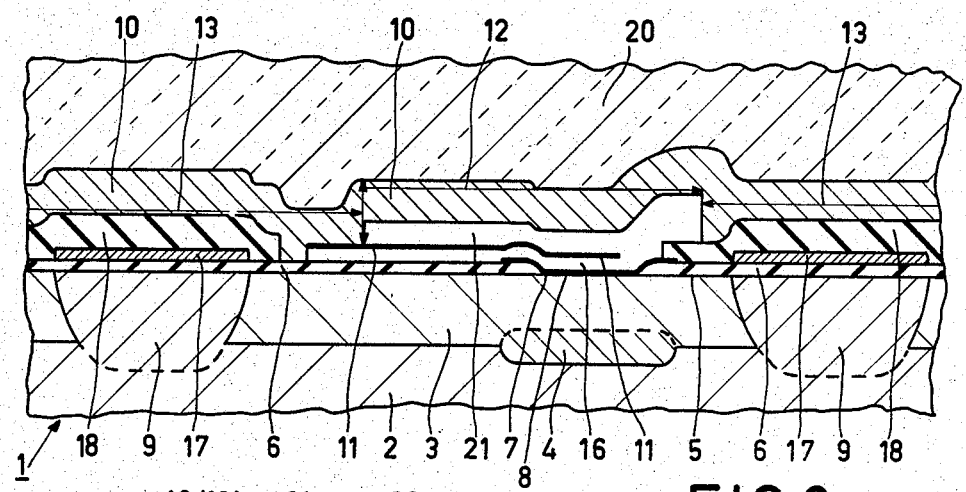
FIG. 2 is a diagrammatic cross-sectional view of the programmable semiconductor device taken on the line II—II of FIG. 1.
Figure 3:
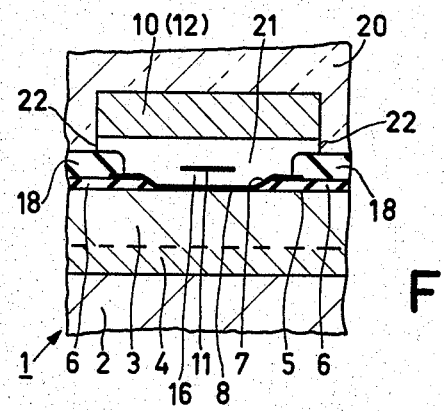
FIG. 3 is a diagrammatic cross-sectional view of the programmable semiconductor device taken on the line III—III of FIG. 1.

FIG. 1 is a diagrammatic plan view and FIGS. 2 and 3 are diagrammatic cross-sectional views taken on the lines II—II and III—III of FIG. 1 of a programmable semiconductor device according to the invention.

In this example a semiconductor body 1 forms part of a supporting member. The semiconductor body 1 comprises a semiconductor substrate 2 of a first conductivity type, for example the p-type, having a thickness of approximately 500 $\mu$m and a resistivity of approximately 1 ohm·cm (corresponding to an acceptor doping of approximately $3 \cdot 10^{15}$ atoms/cm$^3$. An n-type epitaxial layer 3 is grown on this semiconductor substrate 2 in a thickness of approximately 5 micrometers and a resistivity of approximately 1 ohm·cm (corresponding to a doping of approximately $1 \cdot 10^{15}$ donor atoms/cm$^3$.

In this example the programmable semiconductor device forms part of a programmable read-only memory having a cross-bar system of crossing groups of lines.

A line of such a group is formed in this example by the low ohmic buried zone 4 having a sheet resistance of approximately 20 ohm/square. In this example this line forms, for example, the bit line of a programmable read-only memory.

The semiconductor circuit elements which may be, for example, diodes or transistors, are formed in this example by rectifying junctions (Schottky diodes) provided above the buried zone 4. For this purpose, an insulating layer 6 of, for example, silicon oxide in a thickness of approximately 0.5 $\mu$m provided on the surface 5 of the semiconductor body 1 comprises a window 7 in which an electrode 8 is provided of a material which forms a rectifying junction (Schottky junction) with the high-ohmic n-type epitaxial silicon. In this example the electrode comprises a platinum-nickel alloy; other suitable materials are, for example, chromium or titanium.

In order to insulate the semiconductor circuit elements and the buried zone 4 electrically from other elements within the semiconductor body 1, for example, a similar zone with associated semiconductor circuit elements extending parallel to the buried zone 4, the semiconductor body 1 comprises separation zones 9 of the p-type which are provided, for example, by means of a deep diffusion through the n-type epitaxial layer 3.

The semiconductor circuit element is present at the area of a crossing of the buried zone 4 and the electric conductor 10 which crosses the buried zone 4 and, for example, forms the word line of a programmable read only memory. The programmable semiconductor device according to the invention comprises an electrically conductive strip 11 which at its one end is connected electrically conductively to the conductor 10 and extends over a part of its length separately from the supporting member, in this example the semiconductor body 1, including the layer 6 provided thereon and the electrode 8 provided in the window 7 in the layer 6 and separated from a bridging part 12 of the conductor 10 present between two supporting parts 13 forming part of the crossing conductor 10.

A part of the strip 11 extends above the semiconductor circuit element, notably above the electrode 8, and is separated therefrom by an intermediate space 16 of approximately 0.3 $\mu$m.

In this example the strip 11 is of nickel and has a thickness of approximately 0.15 $\mu$m. Other suitable materials are cobalt or platinum.

When suitable electric voltages are applied to the buried zone 4 and the conductor 10, for example in a programmable read-only memory by means of addressing circuits, and, if desired, amplifier circuits, these are transferred via the epitaxial layer 3 to the electrode 8 and via the conductor 10 to the programmable connection element 11. As a result of electrostatic attraction the programmable connection element 11 can bend to such an extent that it contacts the electrode 8. When a sufficiently high electric voltage is maintained, a current starts flowing through the conductor 10, the strip 11 and the electrode 8 via the epitaxial layer 3 to the buried zone 4, or conversely. This current may be sufficiently high to form a weld as a result of local heat evolution so that the programmable connection element 11 is permanently connected to the electrode 8. This method is very simple and reliable.

An advantage of a programmable read-only memory manufactured by means of a device as shown in FIG. 1 is the high-read-out rate. This results from the fact that the conductor 10 which is this example forms a word line, is independent, as regards its dimensions, of the dimensions of the strip 11 and notably the thickness and width of the conductor 10 may be chosen to be considerably larger so that its resistance and hence the write and read times of a memory manufactured by means of the device may be very small.

Strips 17 of conductive material, for example aluminum, are provided on the insulating layer 6 and are electrically insulated relative to the crossing conductor 10 by means of, for example, layer 18 of silicon nitride. These strips 17 are contacted at regular distances via contact holes 19 with the buried zone 4 so that in this example a small series resistance in the bit line is obtained.

Finally the device comprises a layer 20 of protective material provided over the conductors 10 and the juxtaposed parts of the supporting member (semiconductor body 1 including the nitride layer 18). The strip 11 thus is present in a space 21 of which at least a part 22 of the walls is formed by said protective material (see FIG. 3). As a protective material, a glass layer may be chosen, for example.

Since the strip 11 is present within the hollow space 21, programming may take place after a device has been passivated entirely and packaged in a suitable package. As a result of this, no unpassivated, unprogrammed devices need be kept in store until the pattern to be provided is known; this presents advantages, both as regards the reliability in that the devices are not exposed in the unpassivated state to undesired ambient conditions (moisture, temperature) and as regards stock control. In addition, programming can now be carried out differently, if desired, per programmable read-only memory and by the buyer himself. The circuit element, in this example a Schottky diode, is present entirely below the conductor 10; as a result of this a high bit density can be achieved.

The use of Schottky diodes in the device shown also increases notably the read-out rate of a programmable read only memory in which such a device is used.

Figure 4:
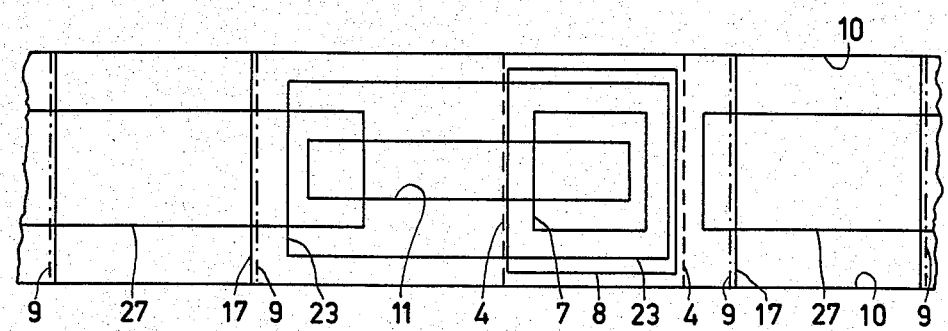
FIG. 4 shows diagrammatically a few mask apertures used in a number of manufacturing steps of the programmable semiconductor device shown in FIGS. 1 to 3, FIGS. 5 to 7 show the programmable semiconductor device of FIG. 2 during various stages of its manufacture.
Figure 5:
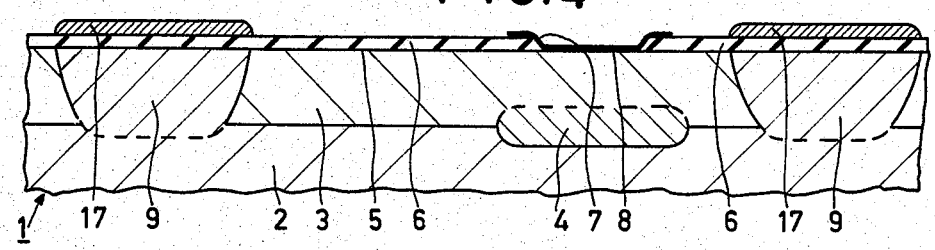
Figure 6:
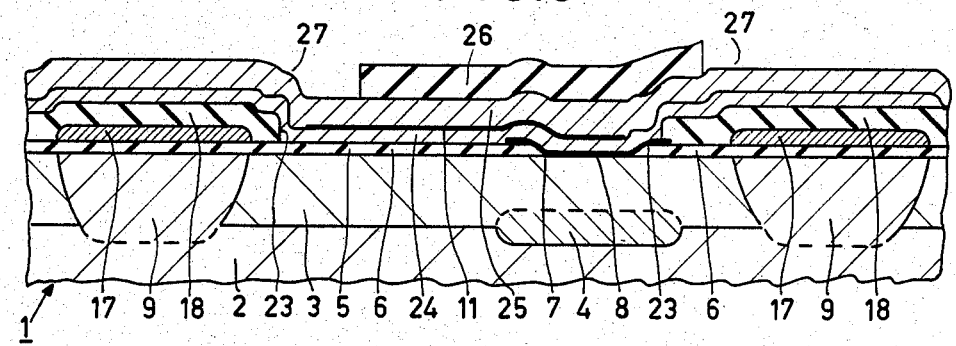
Figure 7:
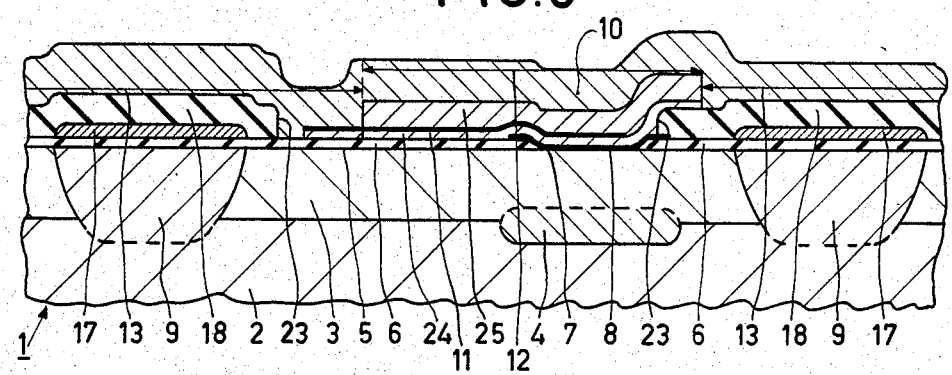

The manufacture of a programmable semiconductor device shown in FIGS. 1 to 3 will now be described in greater detail with reference to FIGS. 4 to 7, in which FIG. 4 shows diagrammatically the mask apertures used in a number of manufacturing steps, while FIGS. 5 to 7 show the device of FIG. 2 in various stages of its manufacture.

Starting material is a p-type substrate 2 having a resistivity of 1 ohm·cm. and a thickness of approximately 500 micrometer. In this substrate a buried zone 4 of the n-type is provided in the usual manner (with a sheet resistance of 20 ohm/square). The epitaxial layer 3 is then grown in a thickness of approximately 5 micrometer and a resistivity of approximately 1 ohm·cm. Also in generally known manner separation zones 9 are then provided by means of diffusion. After having cleaned the surface 5 of the device thus obtained (inter alia removing the oxide layers grown in previous steps) a layer 6 of insulating material, for example silicon oxide, is provided over the whole surface 5, in which layer contact windows 7 are then etched. In these windows a thin layer 8 (approximately 0.1 micrometer) of platinum-nickel is provided which forms a Schottky junction with the underlying high-ohmic silicon. This layer 8 may slightly project over the edge of the window 7; the provision of the layer 8 is therefore not critical. If desired, a thin titanium-tungsten layer may be provided over the layer 8. In generally know manner, conductive tracks 17 of, for example, aluminum, are also provided on the insulating layer 6. In order to be able to contact these tracks 17 with the semiconductor elements in a larger configuration of several elements at regular distances, contact windows 19 (see FIG. 1) are provided in the layer 6 simultaneously with the provision of windows 7 which contact windows 19 during the manufacture of the electrodes 8, if desired, are covered. Herewith the configuration shown in FIG. 5 is obtained.

The device thus obtained is then covered with a layer 18 of silicon nitride in a thickness of approximately 0.7 micrometer, for example, by means of plasma deposition. This layer 18 is provided photolithographically with a window 23 as a result of which parts of the electrode 8 and the insulating layer 6 become exposed. The whole device is then covered with an approximately 0.3 micrometer thick layer 24 of aluminum. In a subsequent step the strip 11 is provided by depositing an approximately 0.15 micrometer thick nickel layer which is then patterned photolithographically by etching by means of a 1:10 diluted nitric acid solution at approximately 40° C. The remaining nickel in this example is situated entirely within the window 23 (see FIG. 4). However, this latter is not strictly necessary, while also variations are possible in the shape of the strip 11. A layer 25 of aluminum in a thickness of approximately 0.7 micrometer is then provided. The assembly is then provided with a photoresist layer 26 in which windows 27 are defined photolithographically at the area of supporting parts to be provided. Herewith the configuration shown in FIG. 6 is obtained.

Using the photoresist layer 26 as a mask, the aluminum of the layers 24, 25 is etched away at the area of the windows 27 in a 1% solution of sodium hydroxide at a temperature of approximately 40° C., after which the whole device is provided with a layer of nickel in a thickness of approximately 1 micrometer. This is preferably done by means of electrodeposition so as to prevent short-circuits. As a matter of fact it has been found that the aluminum of the intermediate layers 24, 25 usually can contain apertures, so-called pin holes, which during the deposition of nickel by means of sputtering can be filled with nickel which is not attacked in the subsequent etching step and can thus form short-circuits. By using electrodeposition, the growth occurs only in one direction so that short-circuits are avoided, as described in Applicant's U.S. patent application Ser. No. 500,791, filed June 7, 1983, the contents of which are incorporated in this application by reference. A very thin layer of nickel in the order of 5 nanometers is previously deposited notably to ensure a good electrodeposition on the silicon oxide 6 and silicon nitride 18. However, this layer is too thin to cause said short-circuit.

From the layer of nickel thus provided, the electric conductors 10 are then etched by means of photolithographic etching methods by using a solution of 10% nitric acid in water at approximately 40° C. Herewith the configuration shown in FIG. 7 is obtained in which aluminum 24, 25 is still present not only below the bridging part 12 of the conductor 10 present between the supporting part 13 but also beyond the plane of the drawing on the layer 18 of silicon nitride. The aluminum is then removed in an etching bath of 1% sodium hydroxide in water at approximately 40° C. After the aluminum has been removed entirely from the supporting member, a passivating layer 20 of glass or silicon oxide is provided over the assembly by means of, for example, vapor deposition or other suitable deposition methods. The conductor 10 serves as a mask so that in the ultimate device the strip 11 is encapsulated within a space 21, a part 22 of the walls of which is formed by the passivating layer 20. Herewith the device shown in FIGS. 1 to 3 is obtained.

Figure 8:
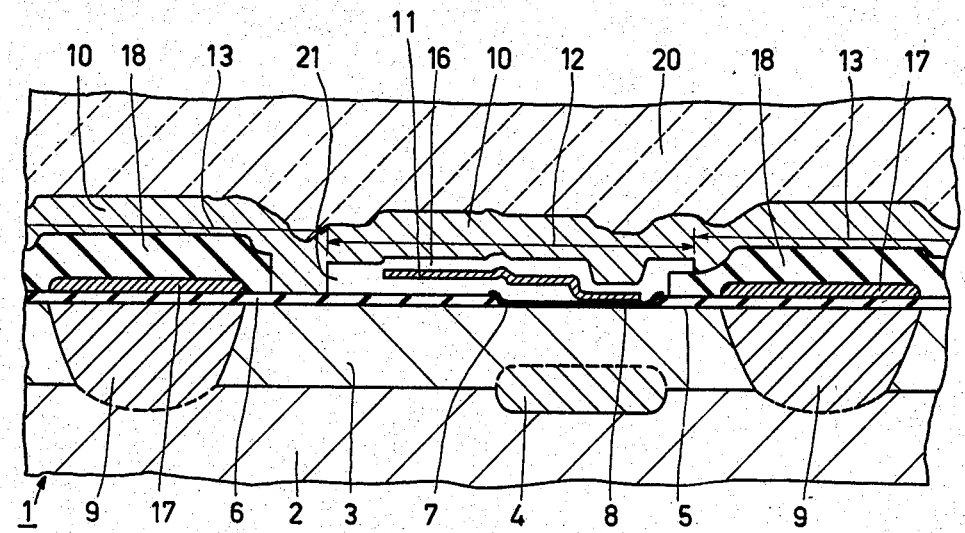
FIG. 8 is a diagrammatic cross-sectional view of a second embodiment of a programmable semiconductor device in accordance with the invention.

FIG. 8 is a cross-sectional view of a modified embodiment of the device shown in FIG. 2 in which in the unprogrammed state the strip 11 is electrically conductively connected to the electrode 8. A narrow space 16 is present between the conductor 10 and the strip 11. Otherwise the reference numerals have the same meanings as those of FIG. 2. When a sufficiently high potential difference is applied between the conductor 10 and the strip 11, a contact will be produced again as a result of electrostatic attraction so that a weld can be formed again.

The manufacture of the device shown in FIG. 8 occurs analogously to that of the device shown in FIG. 2, on the understanding that prior to providing the strip 11 in the first auxiliary layer 24 at the area of the electrode 8 a window is provided which exposes at least a part of the electrode via which window the strip 11 is contacted with the electrode 8.

Figure 9:
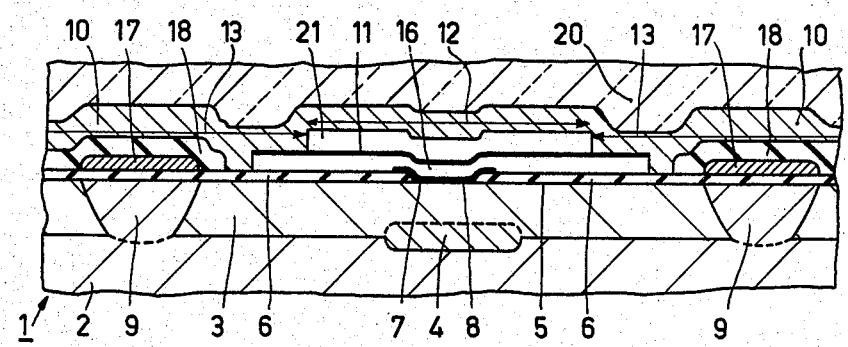

Of course the invention is not restricted to the above-described embodiment but may variations are possible to those skilled in the art without departing from the scope of this invention. FIG. 9, for example, shows a modified embodiment of the device shown in FIG. 2 in which the strip 11 is connected at both ends to the conductor 10. Although the strip 11 thus has a larger rigidity, this configuration is simpler from a technical point of view of alignment and can hence be manufactured in a more reproduceable manner than the configuration shown in FIG. 2. Furthermore, the insulation between the buried zone 4 may also take place by means of local oxidation methods instead of by the deep p-type zone 9, while for the circuit element instead of Schottky diodes also p-n diodes or transistors (bipolar transistors as well as field effect transistors) may be chosen.

In the embodiments shown, the parallel conductors 17 may also be omitted, if necessary. In that case the insulating layer 18 is not necessary either and the supporting paths 13 are directly provided on the insulating layer 6.

In the example shown the supporting member is formed by semiconductor body in which the semiconductor circuit elements are realized. In another embodiment it is possible to provide the semiconductor circuit elements on an insulating supporting member, for example, by means of the silicon-on-sapphire technique.

Figure 10:
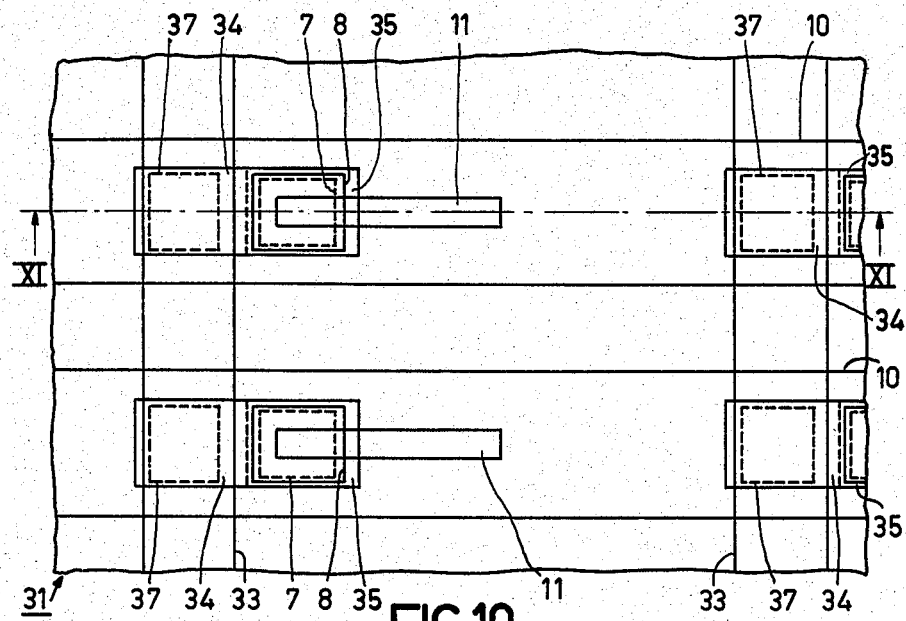
FIG. 10 is a plan view and FIG. 11 a cross-sectional view taken on the line XI—XI in FIG. 10 of still another embodiment of a programmable semiconductor device in accordance with the invention.
Figure 11:
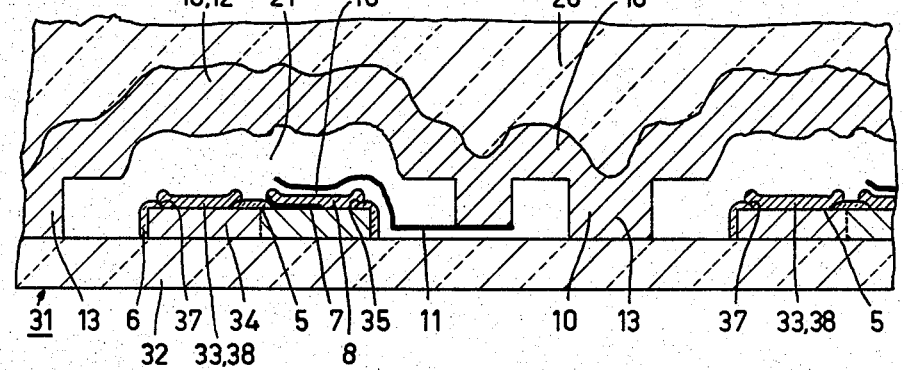

For example, FIG. 10 is a diagrammatic plan view and FIG. 11 a cross-sectional view taken on the line XI—XI of FIG. 10 of such a programmable semiconductor device according to the invention.

In this example the device 31 comprises a supporting member 32 of insulating material, for example sapphire, on which a cross-bar system is provided of conductor tracks 33 provided on the supporting member 32 and conductors 10 crossing said conductor tracks 33. At the area of the crossings of the cross-bar system, semiconductor circuit elements are provided on the insulating supporting member 32, in this example diodes with p-type zones 34 and n-type zones 35. The conductors 10 bridge the diodes and are supported at the area of the supporting parts 13.

Figure 12:
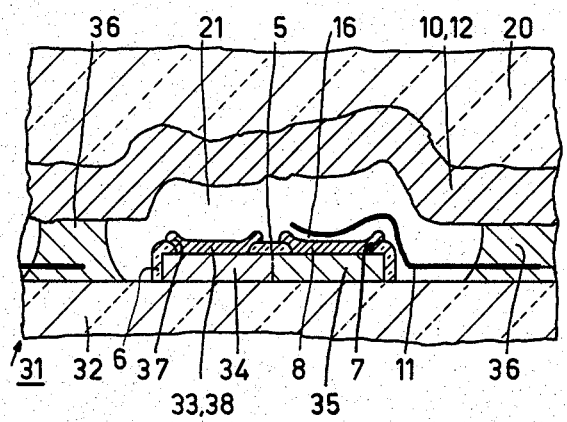
FIG. 12 is a diagrammatic cross-sectional view of another embodiment of a programmable semiconductor device shown in FIG. 11.

The conductor tracks 33 which, for example, may again be bit lines of a programmable read-only memory are contacted with the p-type zones 34 at the surface 5 of the diodes via contacts 38 and windows 37 provided in an insulating layer 6 protecting the diodes. Electrodes 8 contact the n-type zones 35 via contact windows 7. Below the conductors 10 an electrically conductive strip 11 is present again which in this example is connected at one end to the conductor 10 and extends separately from the supporting member 32 and the semiconductor circuit element and also separately from the conductor 10 to above an electrode 8. Programming in this example takes place again by means of electrostatic attraction. The semiconductor circuit element (diode) is present below a bridging part 12 between two supporting parts 13 of the conductor 10. Of course, several diodes may be present below one bridging part 12. The assembly is covered again with a passivating layer 20, so that the programmable connection element 11 is present in a hollow space 21. During the manufacture of the cross-bar system according to the method described in U.S. patent application Ser. No. 500,791 the conductors 10 are supported by supporting parts of aluminum which is conductively connected to the conductors 10. In such a device it is alternatively possible to connect the programmable connection element 11 via a supporting part 36 to the conductor 10 in an electrically conductive manner. FIG. 12 is a cross-sectional view of such a device; the reference numerals again have the same meanings as those of FIG. 11.

What is claimed is:

1. A programmable semiconductor device comprising a supporting member having a semiconductor circuit element and an electric conductor which belongs to a first line and which can be connected electrically conductively to the semiconductor circuit element, characterized in that the device comprises:
   a strip of electrically conductive material which is connected electrically conductively at least at one end of the conductor belonging to the first line, which strip is separated from the semiconductor circuit element or a contact layer connected thereto electrically conductively at least over a part of its length by gas or a vacuum, which part extends separately from the electric conductor above the semiconductor circuit element or the contact layer and is separated therefrom by an intermediate space proportioned such that as a result of electrostatic attraction between the strip and the semiconductor circuit element or the contact layer a connection can be formed between the strip and the semiconductor circuit element or the contact layer;
   wherein said strip of electrically conductive material consists of a material different from the material used for said electric conductor and for the semiconductor metallization; and
   said strip of electrically conductive material is positioned below said electric conductor.

2. A programmable semiconductor device comprising a supporting member having a semiconductor circuit element and an electric conductor belonging to a first line which can be connected electrically conductively to the semiconductor circuit element, characterized in that the device comprises:
   a strip of electrically conductive material which is connected electrically conductively to the semiconductor circuit element, in which a part of the strip extends separately from the supporting member, the semiconductor circuit element or a contact layer connected therewith electrically conductively below the electric conductor belonging to the first line, which part is separated from the conductor by gas or a vacuum with an intermediate space between the strip and the conductor proportioned such that as a result of electrostatic attraction between the strip and the conductor a connection can be formed between the strip and the conductor;

wherein said strip of electrically conductive material consists of a material different from the material used for the electric conductor and for the semiconductor metallization; and said strip of electrically conductive material is positioned below said electric conductor.

3. A programmable semiconductor device as claimed in claim 1 or 2, characterized in that the strip is present in a hollow space the walls of which are formed at least partly by protective material which is provided over parts of the supporting member or the semiconductor circuit element present beside the conductor.

4. A programmable semiconductor device as claimed in claim 1 or 2, characterized in that the strip of conductive material comprises one or more of the materials of the group nickel, cobalt and platinum.

5. A programmable semiconductor device as claimed in claim 1 or 2, characterized in that the thickness of the strip of electrically conductive material is at most 0.5 $\mu$m.

6. A programmable semiconductor device as claimed in claim 1 or 2, characterized in that the intermediate space between the separately extending part of the strip of electrically conductive material and the semiconductor circuit element or the contact layer is at most 0.5 micrometer.

7. A programmable semiconductor device as claimed in claim 2, characterized in that the intermediate space between the conductors belonging to the first line and the part of the strip of electrically conductive material extending separately is at most 0.5 micrometer.

8. A programmable semiconductor device as claimed in claim 1 or 2, characterized in that the first line forms part of a first group of lines which forms a cross-bar system with a second group of lines which cross the first group, the semiconductor circuit element being present at the area of a crossing of the cross-bar system and being connected to a line of the second group.

9. A programmable semiconductor device as claimed in claim 1 or 2, characterized in that the supporting member comprises a semiconductor body in which the semiconductor circuit element is provided.

10. A programmable semiconductor device as claimed in claim 9, characterized in that the line of the second group comprises at least a zone buried in the semiconductor body.

11. A programmable semiconductor device as claimed in claim 10, characterized in that the buried zone is contacted at regular distances to a strip electrically conductive material present on the surface of the semiconductor body.

12. A programmable semiconductor device as claimed in claim 11, characterized in that the strip of electrically conductive material extends substantially parallel to the buried zone.

13. A programmable semiconductor device as claimed in claim 9, characterized in that the semiconductor circuit element comprises diodes having a rectifying junction between a low-doped semiconductor zone above the buried zone and an electrode contacting the low-doped semiconductor zone.

* * * * *